United States Patent [19]

Gawargy

[11] Patent Number: 4,647,843
[45] Date of Patent: Mar. 3, 1987

[54] TRIMMING RESISTANCES IN SYMMETRICAL POLYPHASE NETWORKS

[75] Inventor: Mumtaz B. Gawargy, Nepean, Canada

[73] Assignee: Northern Telecom Limited, Montreal, Canada

[21] Appl. No.: 602,342

[22] Filed: Apr. 20, 1984

[30] Foreign Application Priority Data

Feb. 16, 1984 [CA] Canada .................................. 447,590

[51] Int. Cl.⁴ .......................... H03H 1/02; H01P 1/22
[52] U.S. Cl. ..................................... 323/370; 333/172
[58] Field of Search ............... 323/353, 354, 297, 365, 323/370; 333/172, 185

[56] References Cited

U.S. PATENT DOCUMENTS

| 4,123,712 | 10/1978 | Mikhael | 333/172 |
| 4,181,903 | 1/1980 | Holland et al. | 333/172 |
| 4,302,737 | 11/1981 | Kausche et al. | 333/172 |

OTHER PUBLICATIONS

Mikhael, W., "Sequence Discriminators and Their Use in Frequency Division Multiplex-Communication Systems", IEEE Trans. on Circuits & Systems, v. CAS-26, No. 2, Feb. '79, pp. 117-129.

Primary Examiner—Patrick R. Salce
Assistant Examiner—D. L. Rebsch
Attorney, Agent, or Firm—R. John Haley

[57] ABSTRACT

A symmertical polyphase network consists of a ring of series-connected alternate resistors and capacitors, with junction points therebetween alternately forming inputs and outputs of the network. For example there are four resistors and four capacitors. The resistors are trimmed so that the product of the resistance and the capacitance of the components connected to each respective output is equal to a product RC, R and C being the nominal resistance and capacitance of the resistors and capacitors.

5 Claims, 1 Drawing Figure

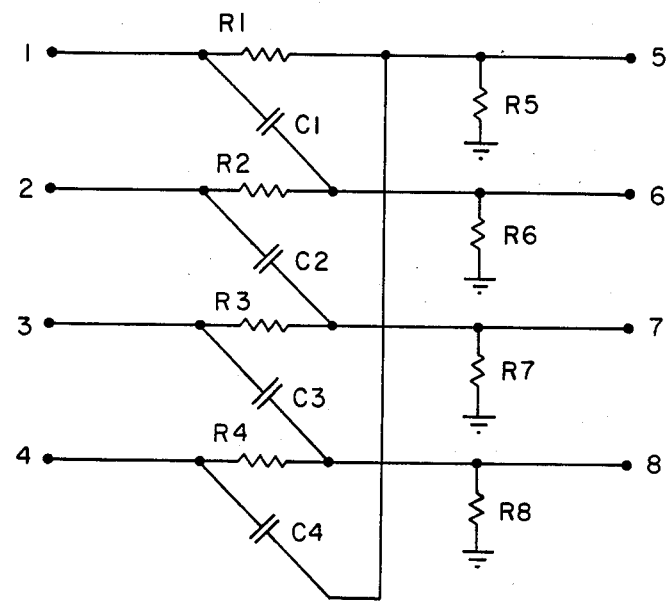

TRIMMING RESISTANCES IN SYMMETRICAL POLYPHASE NETWORKS

This invention relates to symmetrical polyphase networks, and to a method of trimming resistances thereof.

It is known for example from Mikhael U.S. Pat. No. 4,123,712 issued Oct. 31, 1978 to provide a symmetrical polyphase network, also known as a sequence discriminator, which comprises a plurality of cascaded sections, each consisting of a plurality of interconnected resistors and capacitors. Each section has for example four resistors, all having the same nominal resistance, and four capacitors, all having the same nominal capacitance, to provide a response having a notch at a frequency determined by the resistance and capacitance, the different cascaded sections providing notches at different frequencies to provide an overall desired response.

In order to manufacture symmetrical polyphase networks at a relatively low cost, thick film techniques are generally used, the resistors of each network section being trimmed (for example using a laser in known manner) to the desired value after they have been formed on the thick film substrate. The resistors may obviously be trimmed to their nominal resistance, but component tolerances in this case will generally cause the network to fail to provide the desired characteristics, in particular a high attenuation (>60 dB) in the stop-band of the network. In any event, very close tolerance capacitors must be used.

In "Sequence Discriminators and Their Use in Frequency Division Multiplex-Communication Systems" by Wasfy B. Mikhael, IEEE Transactions on Circuits and Systems, Vol. CAS-26, No. 2, February 1979, pages 117 to 129 there is described at pages 125 to 126 an improved resistor trimming procedure in which, for each network section having four resistors and four capacitors, the actual capacitances of the capacitors are measured and averaged, and the resistance value to which the four resistors are trimmed is calculated as the product of the nominal resistance and the nominal capacitance divided by the average capacitance.

In the simulation reported in the paper, and with the addition of a further trimming capacitor, this resulted in a yield of "about 100 percent". In practice, however, it has been found that this technique does not produce a sufficiently high yield, especially with increasingly stringent demands being placed on the characteristics of symmetrical polyphase networks.

An object of this invention is therefore to provide an improved method of trimming resistors of a symmetrical polyphase network, and to provide an improved symmetrical polyphase network as a result of such method.

According to one aspect of this invention there is provided a method of trimming a plurality of resistors of a symmetrical polyphase network which also comprises a like plurality of capacitors, the resistors and capacitors being alternately connected in series in a ring, alternate junction points between the resistors and the capacitors defining a like plurality of inputs and a like plurality of outputs of the network, the method comprising trimming each individual resistor so that the product of its resistance with the actual capacitance of the capacitor which is connected to the same output as the resistor is equal to a product RC, where R and C are respectively a nominal resistance and a nominal capacitance of respectively said resistors and said capacitors.

According to another aspect, this invention provides a symmetrical polyphase network comprising a plurality of resistors and a like plurality of capacitors alternately connected in series in a ring, alternate junction points between the resistors and the capcitors defining a like plurality of inputs and a like plurality of outputs of the network, where the resistors are trimmed so that the product of the resistance and the capacitance of the resistor and the capacitor connected to the same respective output is equal to a product RC, where R and C are respectively a nominal resistance and a nominal capacitance of respectively said resistors and said capacitors.

Conveniently there are four resistors and four capacitors.

The invention will be further understood from the following description with reference to the accompanying drawing, which schematically illustrates a symmetrical polyphase network.

Referring to the drawing, there is illustrated a single-section symmetrical polyphase network having four inputs 1 to 4 and four outputs 5 to 8. Four resistors R1 to R4 are connected between the inputs 1 to 4 respectively and the outputs 5 to 8 respectively. In addition, four capacitors C1 to C4 are connected between the inputs 1 to 4 respectively and the outputs 6, 7, 8, and 5 respectively. The network can alternatively be drawn as a ring of alternating series-connected resistors and capacitors, with the inputs and outputs at alternate junction points.

In addition, as illustrated, four impedances, represented by resistors R5 to R8, are connected between the outputs 5 to 8 respectively and circuit ground. However, these impedances are optional and may be omitted.

The general form of symmetrical polyphase network section shown in the drawing and described above is known for example from U.S. Pat. No. 4,123,712 already referred to. Accordingly, it is not necessary here to describe the manner in which such a network section operates and is used. It is sufficient here to observe that a plurality of such network sections, with or without the resistors R5 to R8, are typically cascaded to provide an overall symmetrical polyphase network or sequence discriminator which is advantageously used in a single sideband modulation arrangement.

As in the prior art, the capacitors C1 to C4 all have the same nominal capacitance, and the resistors R1 to R4 all have the same nominal resistance. However, in the prior art all of the resistors and capacitors in any individual network section have been treated as being identical in all respects. For example, in U.S. Pat. No. 4,123,712 all of the corresponding resistors and capacitors in any individual network section are given the same references, e.g. R1 and C1, and in the paper by Wasfy B. Mikhael referred to above, all of the resistors in any individual network section are trimmed to the same value.

In contrast to the prior art, in the present invention the resistors R1 to R4 and the capacitors C1 to C4 of the network section, although they have the same nominal resistance and capacitance, are treated individually to allow for component tolerances from the nominal values. In particular, the resistors R1 to R4 are individually trimmed in the manner described below, whereby they have different actual resistances, to provide an overall improved performance of the network section.

The invention arises from a consideration of the parameters of the network section in dependence upon the individual resistance and capacitance values of the section. Considering only the input 1 and the output 5, and ignoring any effect produced by the resistors R5 to R8, it can be shown that the following parameters have the following values for positive and negative input signal sequences of frequency $\omega$ and where scribed above may be made without departing from the scope of the invention, which is defined by the claims.

What is claimed is:

1. A method of trimming a plurality of resistors of a symmetrical polyphase network which also comprises a like plurality of capacitors, the resistors and capacitors $$j = \sqrt{-1}:$$

| Parameter | | Positive Sequence | Negative Sequence |
|---|---|---|---|
| Voltage Loss | $\left(\dfrac{Vin}{Vout} \mid Iout = 0\right)$ | $\dfrac{1 + j\omega\,C4R1}{1 - \omega\,C4R1}$ | $\dfrac{1 + j\omega\,C4R1}{1 + \omega\,C4R1}$ |
| Transfer Impedance | $\left(\dfrac{Vin}{Iout} \mid Vout = 0\right)$ | $\dfrac{R1}{1 - \omega\,C4R1}$ | $\dfrac{R1}{1 + \omega\,C4R1}$ |
| Transfer Admittance | $\left(\dfrac{Iin}{Vout} \mid Iout = 0\right)$ | $\dfrac{\omega C4(j + 1) + \omega C1(j - 1)}{1 + \omega\,C4R1}$ | $\dfrac{\omega C4(j - 1) + \omega C1(j + 1)}{1 + \omega\,C4R1}$ |
| Current Ratio | $\left(\dfrac{Iin}{Iout} \mid Vout = 0\right)$ | $\dfrac{1 + j\omega\,C4R1}{1 - \omega\,C4R1}$ | $\dfrac{1 + j\omega\,C1R1}{1 + \omega\,C4R1}$ |

From the above values it can be seen that all of the parameters are dependent upon the product C4R1. By analogy, it can be shown that for the input-output combinations 2-6, 3-7, and 4-8 the respective parameters are all dependent upon the products C1R2, C2R3, and C3R4.

In accordance with this invention, therefore, the resistors R1 to R4 are individually trimmed to make the products C4R1, C1R2, C2R3, and C3R4 respectively all equal to a product RC, where R is the nominal resistance of each of the resistors R1 to R4 and C is the nominal capacitance of each of the capacitors C2 to C4. To this end, the capacitance C4 of the capacitor C4 is measured and the resistor R1 is trimmed in known manner to the resistance RC/C4, and the other resistors are trimmed individually in a similar manner.

The resistors R5 to R8, if provided, are all trimmed to this nominal resistance in known manner.

The trimming procedure in accordance with the invention as particularly described above results in a closer matching of the parameters of the network section than has hitherto been achieved in practice. In consequence, for capacitors of a given tolerance the trimming procedure enables an improved symmetry, and hence performance, of the network section to be achieved.

Although the invention has been described above in relation to a single network section, it applies equally to the individual sections of a multiple-section symmetrical polyphase network. In addition to the optional provision of the resistors R1 to R5, numerous other modifications, variations, and adaptations to the network described above may be made without departing from the scope of the invention, which is defined by the claims.

What is claimed is:

1. A method of trimming a plurality of resistors of a symmetrical polyphase network which also comprises a like plurality of capacitors, the resistors and capacitors being alternately connected in series in a ring, alternate junction points between the resistors and the capacitors defining a like plurality of inputs and a like plurality of outputs of the network, the method comprising trimming each individual resistor so that the product of its resistance with the actual capacitance of the capacitor connected to the same output as the resistor is equal to a product RC, where R and C are respectively a nominal resistance and a nominal capacitance of respectively said resistors and said capacitors.

2. A method as claimed in claim 1 wherein the network comprises four resistors and four capacitors.

3. A symmetrical polyphase network comprising a plurality of resistors and a like plurality of capacitors alternately connected in series in a ring, alternate junction points between the resistors and the capacitors defining a like plurality of inputs and a like plurality of outputs of the network, wherein the resistors are trimmed so that the product of the resistance and the capacitance of the resistor and the capacitor connected to the same respective output is equal to a product RC, where R and C are respectively a nominal resistance and a nominal capacitance of respectively said resistors and said capacitors.

4. A symmetrical polyphase network as claimed in claim 3 wherein the network comprises four resistors and four capacitors.

5. A symmetrical polyphase network as claimed in claim 3 and including a like plurality of impedances each connected between a respective one of said outputs and circuit ground.

* * * * *